US006666949B1

(12) United States Patent
Hillman et al.

(10) Patent No.: US 6,666,949 B1
(45) Date of Patent: Dec. 23, 2003

(54) UNIFORM TEMPERATURE WORKPIECE HOLDER

(75) Inventors: Gary Hillman, Livingston, NJ (US); David Bartok, Union, NJ (US)

(73) Assignee: Thermodigm, LLC, Montville, NJ (US)

( * ) Notice: Subject to any disclaimer, the term of this patent is extended or adjusted under 35 U.S.C. 154(b) by 160 days.

(21) Appl. No.: 09/716,774

(22) Filed: Nov. 20, 2000

Related U.S. Application Data
(60) Provisional application No. 60/166,557, filed on Nov. 19, 1999.

(51) Int. Cl.$^7$ ............................ C23F 1/00; H01L 21/306
(52) U.S. Cl. .................. 156/345.52; 118/724; 118/725; 118/500; 118/728; 156/345.51; 219/385; 219/521
(58) Field of Search ................................. 118/728, 724, 118/725; 219/385, 390; 156/345.52, 345.51

(56) References Cited

U.S. PATENT DOCUMENTS

| 3,603,767 A | | 9/1971 | Scicchitano ................ 219/439 |
| 3,968,787 A | * | 7/1976 | Basiulis ....................... 126/390 |
| 4,245,147 A | | 1/1981 | Cummings et al. ......... 219/462 |
| 4,582,121 A | | 4/1986 | Casey ........................... 165/1 |
| 4,955,361 A | | 9/1990 | Sotani et al. ................ 126/374 |
| 5,252,807 A | * | 10/1993 | Chizinsky ................... 219/390 |
| 6,021,044 A | * | 2/2000 | Neville, Jr. et al. ......... 361/700 |
| 6,229,116 B1 | * | 5/2001 | Shirakawa et al. ......... 219/390 |

FOREIGN PATENT DOCUMENTS

| JP | 63065066 A | * | 3/1988 | ............ C23C/14/26 |
| JP | 05-315293 | * | 11/1993 | ......... H01L/21/302 |
| JP | 2003021480 A | * | 1/2003 | ............ F28D/15/02 |

* cited by examiner

*Primary Examiner*—Parviz Hassanzadeh
*Assistant Examiner*—Karla Moore
(74) *Attorney, Agent, or Firm*—Lerner, David, Littenberg, Krumholz & Mentlik, LLP

(57) ABSTRACT

An apparatus and method for maintaining substantially uniform temperature of semiconductor wafers and similar workpieces is provided. The method and apparatus utilize a workpiece holder that is substantially a closed chamber, which includes a wall structure including a workpiece engaging wall in thermal communication with the chamber. The workpiece holder also includes a condenser that communicates with the chamber and a heater that applies heat to the chamber. The heater applies heat to a fluid inside the chamber such that when the fluid vaporizes within the chamber the condenser abstracts the heat from the fluid. This causes continual circulation of vapor through the interior of the chamber, which helps to maintain temperature uniformity. A feedback control system connected to one or more temperature sensors can control the heater, the condenser or both so as to maintain a predetermined set point temperature within the chamber.

18 Claims, 4 Drawing Sheets

UNIFORM TEMPERATURE WORKPIECE HOLDER

CROSS-REFERENCE TO RELATED APPLICATION

The present application claims the benefit of U.S. Provisional Patent Application No. 60/166,557 filed Nov. 19, 1999, the disclosure of which is hereby incorporated by reference herein.

FIELD OF THE INVENTION

The present invention relates to the control of substrate temperature. More particularly, the present invention relates to an apparatus and method for controlling temperature uniformity of a semiconductor wafer and similar workpiece during processing.

BACKGROUND OF THE INVENTION

In typical processes for manufacturing semiconductor devices, a thin, flat disc of semiconductor material referred to as a "wafer" is subjected to processes such as chemical vapor deposition, etching, coating, photographic patterning and other processes which form the desired features on the wafer. In many of these processes, it is important to maintain the entire wafer at a uniform temperature. It is particularly important to maintain a wafer at uniform temperature during so-called "post-exposure bake" of a photoresist. In certain semiconductor processing procedures, a photoresist on a wafer is exposed to illumination in a pattern, and then baked to develop the resist. Depending upon the type of resist used, the areas of the resist which were illuminated may be either more readily cured or less readily cured. The post-exposure baking step after illumination helps create the pattern of cured and uncured areas.

One approach which has been used heretofore to maintain a uniform temperature in a semiconductor wafer is to provide a massive block of a metal having high thermal conductivity in contact with the wafer. The block may be heated, as by electrical heating elements. The thermal conductivity of the block helps to limit temperature differences between locations on the wafer. However, systems of this nature still suffer from significant temperature non-uniformity. A further approach is a multiplicity of individual controlled areas.

SUMMARY OF INVENTION

The present invention provides a simple yet effective device, which can be used to maintain the temperature of semiconductor wafers and other workpieces.

One aspect of the invention provides a workpiece holder. A workpiece holder according to this aspect of the invention includes a wall structure defining a substantially closed chamber. The wall structure includes a workpiece-engaging wall in thermal communication with the chamber. The workpiece holder also includes a condenser that communicates with the chamber and a heater that applies heat to the chamber. For operation, the heater applies heat to a fluid inside the chamber so that the fluid vaporizes within the chamber. When the fluid vaporizes the condenser abstracts the heat from the fluid and condenses it. The fluid throughout the chamber will be maintained substantially at the same temperature. This temperature corresponds to the vaporization temperature of the fluid at a pressure prevailing within the chamber and condenser. Although the present invention is not limited by any theory of operation, it is believed that the condenser and heater cause continual circulation of vapor through the interior of the chamber, which helps to maintain temperature uniformity.

The workpiece holder may include a feedback control system connected to one or more temperature sensors. The feedback control system is also desirably connected to the heater, condenser or both. The feedback control system operates to control the heater, the condenser or both responsive to signals from the temperature sensors so as to maintain a predetermined set point temperature within the chamber.

Another aspect of the invention includes a method of holding the workpiece at a uniform temperature. The method according to this aspect of the invention desirably includes maintaining the workpiece on a holding surface in heat transfer relation with the interior of a chamber; vaporizing a liquid disposed within the chamber to form vapor by supplying heat to the interior of the chamber; and condensing the vapor in a condenser that communicates with the chamber to ensure that some liquid and some vapor are present in the chamber and the vapor continually flows within the chamber and condenser.

Yet another aspect of the invention includes a method of making the workpiece holder. This method includes forming a wall structure containing a workpiece-engaging wall that is defined substantially as a closed chamber. This wall structure is subjected to a preselected pressure differential between the interior and exterior of the chamber corresponding to the pressure differential expected on the wall structure during use. As a result of the pressure differential exerted the workpiece-engaging wall will deform. Most preferably, the workpiece-engaging wall is machined to a preselected shape while it is in its deformed condition. Thus, during use of the workpiece holder, while the workpiece-engaging wall is under the pressure differential, it will have the preselected shape formed by the machining process.

Additional features and advantages of the invention will be set forth in the description which follows. It is to be understood that both the foregoing general description and the following detailed description are exemplary and are intended to provide further explanation of the invention as claimed.

DETAILED DESCRIPTION OF THE PREFERRED EMBODIMENTS

Figure 1:
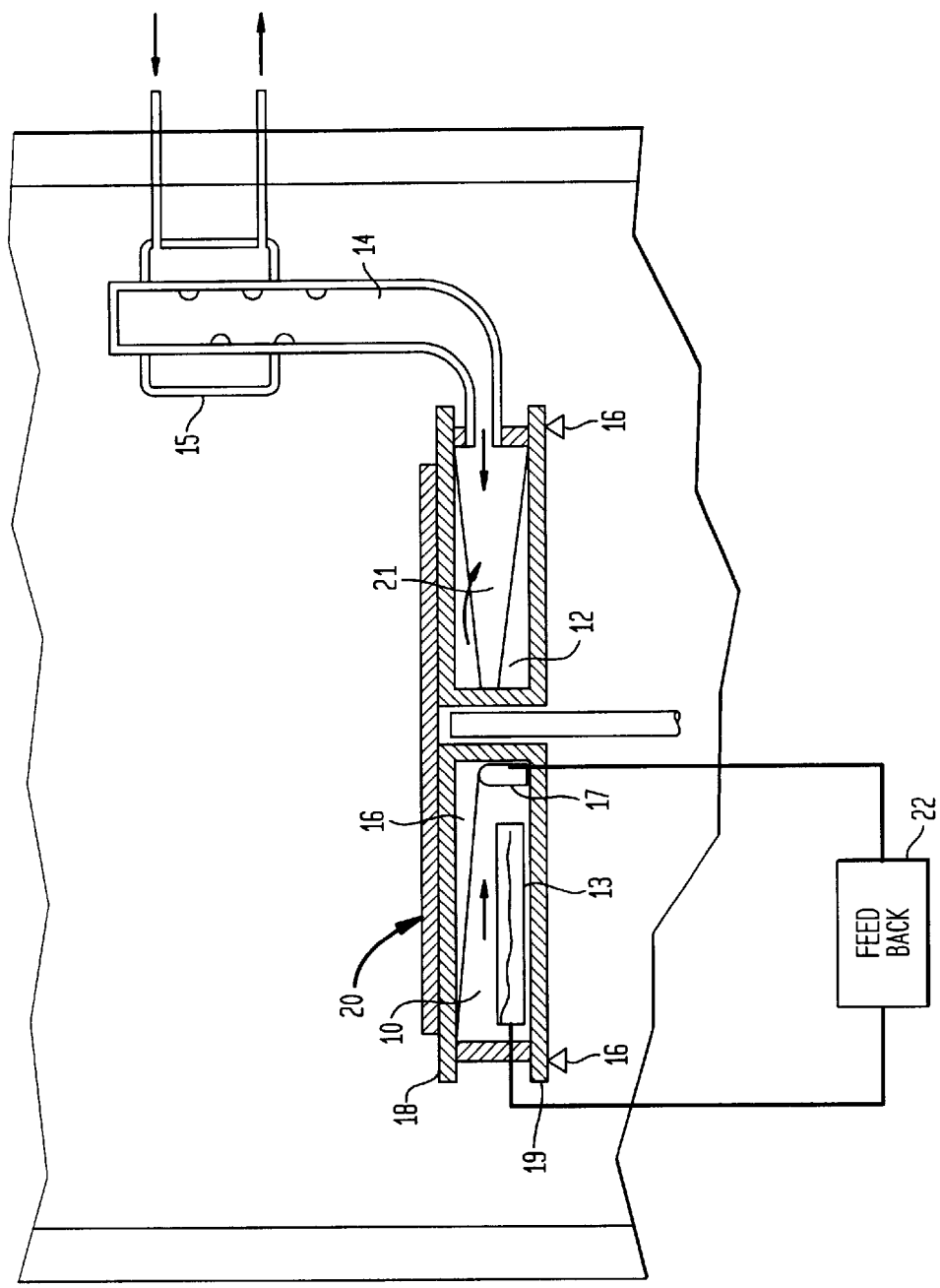
FIG. 1 is a cross sectional view of a workpiece holder according to one embodiment of the present invention.
Figure 7:
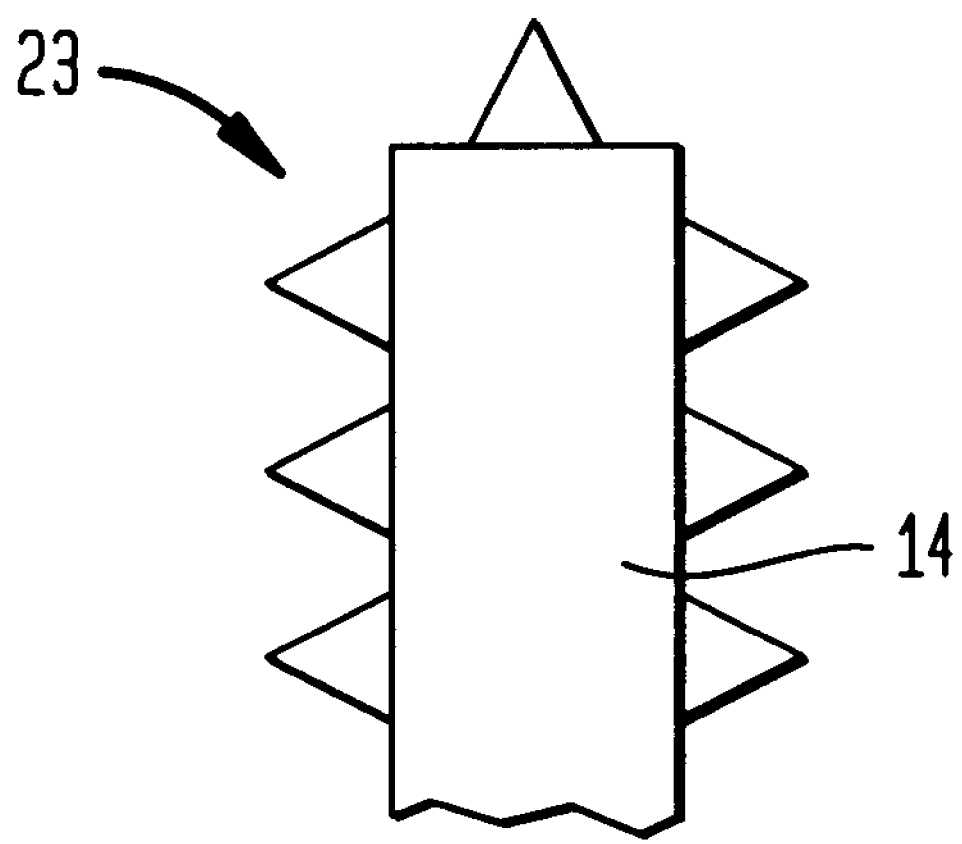
FIG. 7 is a fragmentary diagrammatic view of the heat radiating fins according to a further embodiment of the invention.

As shown in FIG. 1, a chamber 10 holds a fluid 12 such as water, an aqueous fluid such as a water-alcohol azeotrope, or other suitable fluid, which vaporizes and condenses at a uniform composition. The heat supplied by the electrical heater 13 within the chamber 10 causes the fluid 12 to vaporize. The vapor condenses in the condenser 14, and the liquid returns to the chamber 10. Because there are substantial mass flows 21 within the chamber 10, the temperature at all points within the chamber 10 remains essentially equal to the equilibrium vaporization temperature of the fluid 12 at the pressure prevailing within the chamber 10. The chamber 10 should be substantially open so as to allow substantially unobstructed fluid flow within the chamber 10, and thereby minimize pressure differences in the chamber 10, although some structural supports 16 may be disposed within the chamber 10. The condenser 14 can be cooled by a coolant jacket 15 as shown; by radiating fins 23 (FIG. 7) attached to the condenser body, or by any other conventional cooling expedient which allows the condenser 14 to abstract heat at a rate approximately equal to the heat input from the heater.

In one embodiment, the top wall 18 of the chamber 10 is a disc of aluminum having a diameter of about 35 cm; the bottom wall 19 is a similar disc spaced about 5 cm below the upper disc, and the heater supplies about 1000 watts of power. The top wall 18 is maintained at within about 0.1° C. of a uniform temperature. Of course, the invention is not limited to a particular disc size or spacing or heater power supply, and other sizes and temperature are within the scope of the invention.

The temperature within the chamber 10, and hence the temperature of the workpiece-engaging surface 18, can be controlled by adjusting the rate of heat input from the heater 13, the rate of heat removal through the condenser 14, or both. A temperature sensor 17 such as a thermocouple, thermoresistor, or any other temperature-sensitive transducer desirably is mounted in the chamber 10, in a wall of the chamber 10, or at another location where the sensor 17 will be in thermal communication with the chamber 10, i.e., where the temperature of the sensor 17 will closely track the temperature within the chamber 10. The temperature sensor 17 is connected to a feedback control circuit 22, which in turn is connected to the heater 13. In a variant of this system, the condenser 14 is controllable and the feedback control circuit is connected to the control input of the condenser 14. For example, where the condenser 14 is cooled by a circulating coolant, the feedback control circuit can be connected to control the speed of circulation of the coolant. The feedback control circuit may be a conventional analog or digital control circuit, and may include a proportional-integral-derivative ("PID") control algorithm or other conventional algorithms, which are known in the art for holding a set point. In yet another variant, the sensor 17 may be a pressure sensor connected to the interior of the chamber 10 for detecting and monitoring the pressure within the chamber 10. As the pressure varies directly with temperature, pressure measurement can be substituted for temperature measurement. In a further variant, the top end of the condenser 14 may be left open or connected through a pipe to the atmosphere or to another source of constant pressure so that the system self-regulates to a temperature corresponding to the vaporization temperature point at such pressure.

Figure 2:
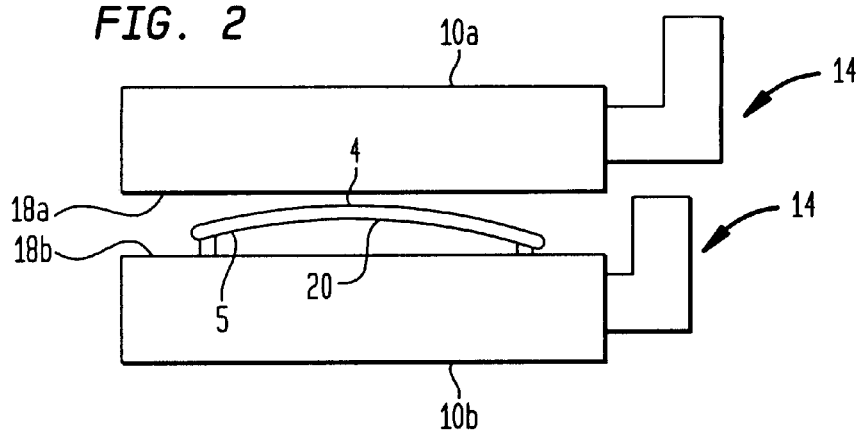
FIG. 2 is an elevations view of a workpiece holder according to an alternative embodiment of the present invention.

In addition to providing precise uniformity of the workpiece-engaging surface 18 on the chamber 10, it is also desirable to provide uniform heat transfer between the workpiece-engaging surface 18 and the wafer 20, so that the wafer 20 temperature will closely follow the temperature of the workpiece-engaging surface 18. As shown in FIG. 2, a pair of chambers 10a, 10b, substantially as described above, can be employed so as to provide uniform-temperature surfaces on both sides of a wafer 20, and thereby provide more precise temperature control of the wafer 20. In this arrangement, the workpiece-engaging surfaces 18a, 18b of the two chambers 10a, 10b face one another. The interiors of the two chambers 10a, 10b may be separate from one another or may communicate with one another through a pipe or conduit so that the two chambers 10a, 10b effectively form a single chamber.

Figure 3:
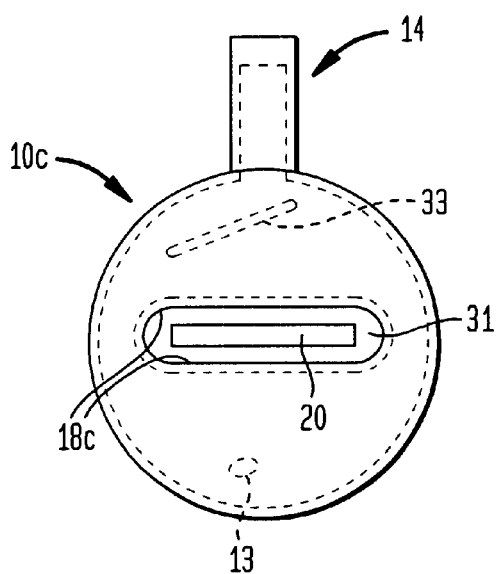
FIG. 3 is an elevational view of a workpiece holder according to another embodiment of the invention.
Figure 4:
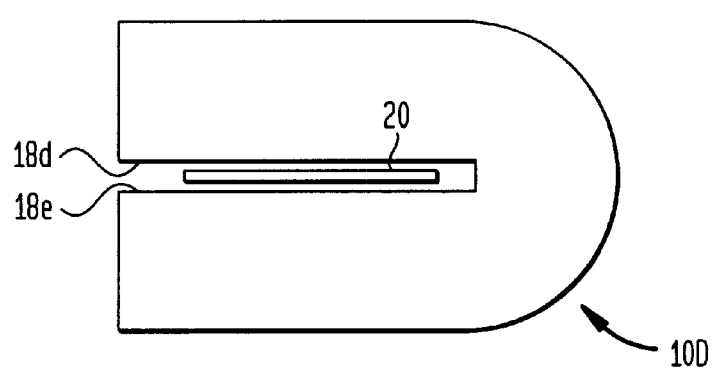
FIG. 4 is an elevational view of a workpiece holder according to a further embodiment of the invention.

In a variant of this approach, (FIG. 3) the chamber 10c may be formed as a toroid enclosing a bore 31, so that the interior surface of the toroid forms the workpiece-engaging surface 18c. The bore 31 of the toroid may have a flattened surface so as to fit more closely around a flat workpiece such as a wafer 20. As shown in FIG. 4, a C-shaped chamber 10d can also provide opposed workpiece-engaging surfaces 18d, 18e. Where opposed surfaces as shown in FIGS. 4–6 are employed, the temperature of the wafer 20 will be substantially uniform even if the wafer 20 is out of plane.

As best seen in FIG. 2, the high spots 4 will be closer to one workpiece-engaging surface 18a, whereas the low spots 5 will be closer to the other workpiece-engaging surface 18b, so that there will be substantially uniform heat transfer to the wafer 20 at all locations. Also, as the opposed workpiece-engaging surfaces 18a, 18b are close to one another and the wafer 20 is disposed between these surfaces, there will be little heat transfer between the wafer 20 and the environment. All points on the wafer 20 will come to equilibrium at the temperature of the workpiece-engaging surfaces 18a, 18b regardless of the rate of heat transfer at each point.

Figure 5:
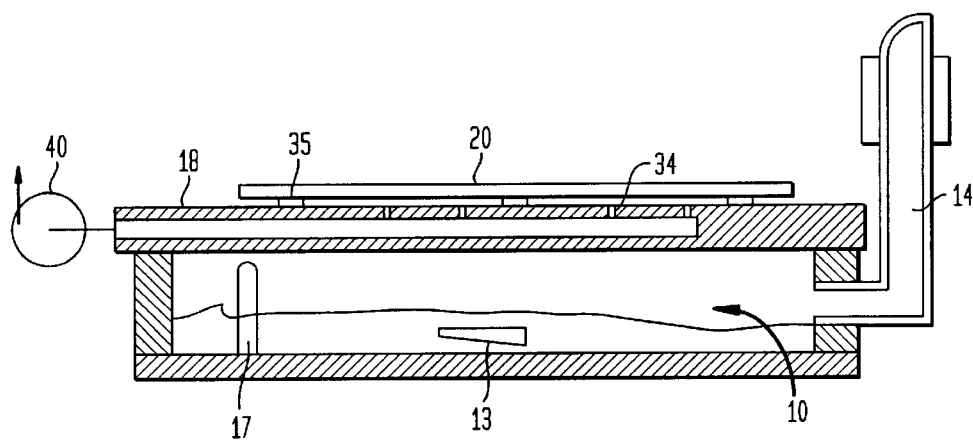
FIG. 5 is a sectional view of a workpiece holder according to another embodiment of the invention.

As shown in FIG. 5, the holder may be provided with vacuum ports 34 extending through the workpiece-engaging surface 18, the vacuum ports 34 being connected to a source of vacuum 40 such as a pump. In this manner, the wafer 20 is held close to the workpiece-engaging surface 18; the higher pressure of the surrounding atmosphere on the side of the wafer 20 facing away from the workpiece engaging surface 18 flattens the wafer 20 against the workpiece-engaging surface 18. As also shown in FIG. 5, the workpiece-engaging surface 18 may be provided with standoffs 35 projecting slightly from such surface. The height of the standoffs 35 is exaggerated in FIG. 5 for clarity of illustration. In practice, the standoffs 35 desirably are about 100 $\mu$m high or less. The standoffs 35 assure that there is a small space between the wafer 20 and the workpiece-engaging surface 18. This provides more uniform heat transfer than would be achieved if the wafer 20 directly abutted the workpiece-engaging surface 18. In that case, minor roughness on the wafer back surface or on the workpiece-engaging surface 18 could lead to significant differences in the local heat transfer rate. The standoffs 35 desirably have small dimensions in the directions parallel to the workpiece-engaging surface 18. The standoffs 35 also have the effect of reducing contamination of the back side of the wafer 20.

Figure 6:
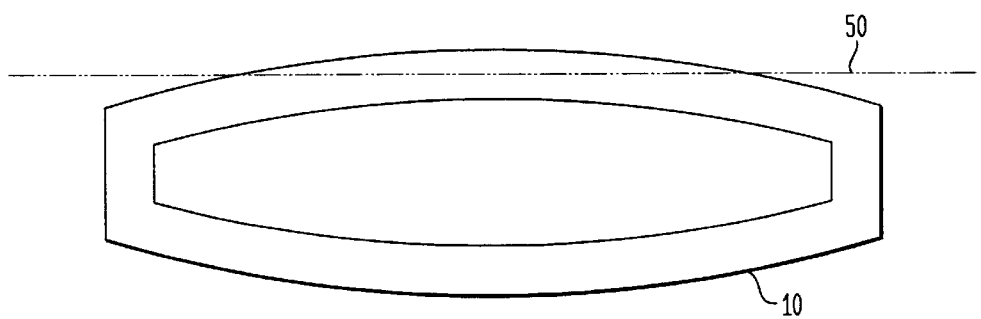
FIG. 6 is a sectional view of a chamber during a manufacturing process according to a further embodiment of the invention.

As shown in FIG. 6, the walls of a chamber 10 subjected to a high pressure differential between the interior and the exterior tend to bulge outwardly. In a fabrication procedure according to a further embodiment of the invention, the chamber 10 is subjected to the same pressure differential which it will see in service. While this pressure, and hence the deformation of the walls, is maintained, the workpiece-engaging surface is machined to the desired configuration as, for example, by grinding it flat along a plane 50. This assures that the workpiece-engaging surface 18 will have the desired configuration in service. The internal pressure may be maintained by any conventional pressure source as, for example, a compressed air source regulated to the desired pressure.

As these and other variations and combinations of the features discussed above can be utilized without departing from the present invention, the foregoing description of the preferred embodiments should be taken by way of illustration rather than by way of limitation of the invention as defined by the claims.

What is claimed:

1. A workpiece holder comprising:
    (a) a wall structure defining a substantially closed chamber, said wall structure including a workpiece-engaging wall in thermal communication with said chamber;
    (b) a condenser communicating with said chamber, said condenser having a condensing surface separate from said workpiece-engaging wall;
    (c) a heater in heat-exchange relation with said chamber, said heater being separate from said workpiece-engaging wall; and
    (d) a fluid in said chamber, said heater being adapted to apply heat to said fluid so that said fluid vaporizes in said chamber and said fluid heats said workpiece-engaging wall, said condenser being adapted to abstract heat from said fluid at said condenser surface, whereby said fluid throughout said chamber will be maintained substantially at a temperature corresponding to the vaporization temperature at a pressure prevailing within said chamber and condenser and said fluid will maintain the chamber and said workpiece-engaging wall at a substantially uniform temperature.

2. A holder as claimed in claim 1 wherein said condenser is a reflux condenser adapted to feed condensed liquid back into said chamber.

3. A holder as claimed in claim 1 further comprising a heat-radiating structure mounted to said condenser in heat-exchange relation therewith.

4. A holder as claimed in claim 1 further comprising a coolant jacket in heat-exchange relation with said condenser and a source of coolant at a temperature below said substantially uniform temperature in communication with said jacket.

5. A holder as claimed in claim 1 wherein said workpiece-engaging wall is a wall bounding said chamber.

6. A holder as claimed in claim 5 wherein said workpiece-engaging wall extends substantially horizontally and forms a top wall of said chamber.

7. A holder as claimed in claim 6 wherein said structure further includes a bottom wall extending generally parallel to said top wall.

8. A holder as claimed in claim 7 wherein said structure further includes a ring-like side wall extending between said top and bottom walls around the periphery of said chamber.

9. A holder as claimed in claim 8 further comprising structural reinforcing members disposed within said chamber.

10. A holder as claimed in claim 7 further comprising one or more pass-through tubes extending through said top and bottom walls and sealingly connected thereto, whereby each pass-through tube defines an opening extending through said chamber but not communicating with said chamber.

11. A holder as claimed in claim 1 further comprising vacuum ports extending through said wall structure to said workpiece-engaging surface, and a vacuum connection communicating with said vacuum ports.

12. A holder as claimed in claim 11 further comprising a plurality of spaced-apart standoffs projecting from said workpiece-engaging surface.

13. A holder as claimed in claim 12 wherein said standoffs are about 100 microns or less high.

14. A holder as claimed in claim 1 further comprising one or more temperature sensors in thermal communication with said chamber.

15. A holder as claimed in claim 14 further comprising a feedback control system connected to said one or more temperature sensors and connected to said heater, said condenser or both, said feedback control system being operative to control said heater, said condenser or both responsive to signals from said one or more temperature sensors so as to maintain said temperature within said chamber at a predetermined set point.

16. A holder as claimed in claim 1 further comprising one or more pressure sensors in thermal communication with said chamber.

17. A holder as claimed in claim 16 further comprising a feedback control system connected to said one or more pressure sensors and connected to said heater, said condenser or both, said feedback control system being operative to control said heater, said condenser or both responsive to signals from said one or more pressure sensors so as to maintain the pressure within said chamber at a predetermined set point and thereby maintain the temperature within said chamber at a predetermined value.

18. A system for treating a workpiece comprising a pair of holders as claimed in claim 1, the workpiece-engaging walls of said holders facing toward one another and being spaced apart from one another so as to define a workpiece-receiving space there between.

* * * * *